United States Patent [19]

Sheldon et al.

[11] Patent Number: 4,614,564

[45] Date of Patent: Sep. 30, 1986

[54] PROCESS FOR SELECTIVELY PATTERNING EPITAXIAL FILM GROWTH ON A SEMICONDUCTOR SUBSTRATE

[75] Inventors: Peter Sheldon, Golden; Russell E. Hayes, Boulder, both of Colo.

[73] Assignee: The United States of America as represented by the United States Department of Energy, Washington, D.C.

[21] Appl. No.: 678,202

[22] Filed: Dec. 4, 1984

[51] Int. Cl.⁴ .................. C03B 23/00; H01L 21/205; H01L 21/365; H01L 21/306
[52] U.S. Cl. .................... 156/657; 148/175; 148/187; 29/576 E; 156/643; 156/644; 156/646; 156/653; 156/659.1; 156/662; 156/649; 357/56; 427/87
[58] Field of Search ............... 156/643, 644, 646, 653, 156/657, 659.1, 662, 649; 148/175, 187; 427/86, 87; 29/576 E; 357/56

[56] References Cited

U.S. PATENT DOCUMENTS

| 4,111,725 | 9/1978 | Cho et al. | 148/175 |
| 4,370,510 | 1/1983 | Stinn | 148/175 X |
| 4,426,767 | 1/1984 | Swanson et al. | 148/175 X |

Primary Examiner—William A. Powell
Attorney, Agent, or Firm—Kenneth L. Richardson; John M. Albrecht; Judson R. Hightower

[57] ABSTRACT

A process is disclosed for selectively patterning epitaxial film growth on a semiconductor substrate. The process includes forming a masking member on the surface of the substrate, the masking member having at least two layers including a first layer disposed on the substrate and the second layer covering the first layer. A window is then opened in a selected portion of the second layer by removing that portion to expose the first layer thereunder. The first layer is then subjected to an etchant introduced through the window to dissolve a sufficient amount of the first layer to expose the substrate surface directly beneath the window, the first layer being adapted to preferentially dissolve at a substantially greater rate than the second layer so as to create an overhanging ledge portion with the second layer by undercutting the edges thereof adjacent to the window. The epitaxial film is then deposited on the exposed substrate surface directly beneath the window. Finally, an etchant is introduced through the window to dissolve the remainder of the first layer so as to lift-off the second layer and materials deposited thereon to fully expose the balance of the substrate surface.

19 Claims, 7 Drawing Figures

PROCESS FOR SELECTIVELY PATTERNING EPITAXIAL FILM GROWTH ON A SEMICONDUCTOR SUBSTRATE

The United States Government has rights in this invention under Contract No. DE-AC02-83CH10093 between the U.S. Department of Energy and the Solar Energy Research Institute, a Division of Midwest Research Institute.

BACKGROUND OF THE INVENTION

1. FIELD OF THE INVENTION

The present invention relates to the deposition of epitaxial films on semiconductor substrates and, more particularly, to an improved process for masking the substrate surface to achieve selective patterning of the epitaxial film growth. Specifically, the present invention relates to the use of a bilayer masking scheme for the growth of epitaxial films such as gallium arsenide and germanium on semiconductor substrates such as silicon, using substrates that may already contain semiconductor devices.

2. DESCRIPTION OF THE PRIOR ART

The growth of high quality epitaxial films such as GaAs and/or Ge on dissimilar semiconductor substrate surfaces has many potential practical applications. However, any number of problems have arisen in attempting to grow such films. For example, attempts to grow GaAs directly on Si substrates have been limited by difficulties in nucleation and lattice mismatch. Despite the inherent problems in this material system, high quality GaAs has been grown on Si substrates both with and without an intermediate layer.

U.S. Pat. No. 4,111,725 discloses a process for growing GaAs epitaxial films on GaAs substrates. The technique disclosed in this patent involves molecular beam epitaxy (MBE) deposition of the GaAs onto the substrate surface through the use of an amorphous $SiO_2$ masking layer. An $SiO_2$ layer is first formed on the substrate, and then apertures are formed in the $SiO_2$ mask using standard photolithographic techniques to create the appropriate patterns for GaAs growth. Once the expitaxial film is deposited through the patterned apertures, the amorphous layer is dissolved. This allegedly then "lifts off" any residual GaAs formed on top of the $SiO_2$ mask.

A distinct problem with the process described in U.S. Pat. No. 4,111,725 arises when applying it to the growth of relatively thick epitaxial films on Si substrates or the like. Such thick epitaxial growth is highly desirable in lattice mismatched material systems in order to maximize the semiconductor properties thereof. Unfortunately, complete dissolution of the single amorphous masking layer so as to achieve a complete and clean lift-off from the substrate is very difficult using prior art techniques, particularly when the epitaxial film is thick.

A highly desirable application of this type of technology would include the formation of epitaxial layers such as GaAs/Ge on a Si substrate wherein the substrate already has Si semiconductor devices previously formed therein. However, without appropriate masking techniques, the underlying Si devices can be poisoned by the diffusion of Ga or As at the time of GaAs film deposition. Moreover, incomplete lift-off resulting from improper or incomplete masking techniques would interfere with subsequent metallization and processing, thus impeding the proper function of the resultant device.

SUMMARY OF THE INVENTION

Accordingly, it is one object of the present invention to provide a process for selectively patterning epitaxial film growth on a semiconductor substrate.

It is another object of the present invention to provide an improved masking technique for precise positioning of epitaxial films on semiconductor substrates.

It is yet another object of the present invention to provide a process for fabricating Si and GaAs semiconductor devices on a single Si substrate chip.

Additional objects, advantages and novel features of the invention shall be set forth in part in the description that follows, and in part will become apparent to those skilled in the art upon examination of the following or may be learned by the practice of the invention. The objects and advantages of the invention may be realized and attained by means of the instrumentalities and in combinations particularly pointed out in the appended claims.

To achieve the foregoing and other objects and in accordance with the purpose of the present invention, as embodied and broadly described herein, a process for selectively patterning epitaxial film growth on a semiconductor substrate is disclosed and includes forming a masking member on the surface of the substrate. The bilayer masking member has at least two layers including a first layer disposed on the substrate and a second layer covering the first layer. A window is then opened in a selected portion of the second layer by removing that portion so as to expose the first layer thereunder. The first layer is subjected to an etchant which is introduced through the window to dissolve a sufficient amount of the first layer to expose the substrate surface directly beneath the window. The first layer is adapted to be preferentially dissolved at a substantially greater rate than the second layer so as to create an overhanging ledge portion in the second layer by undercutting the edges thereof adjacent the window. The epitaxial film is then deposited on the exposed substrate surface directly beneath the window. Finally, an etchant is introduced through the window to dissolve the remainder of the first layer so as to lift-off the second layer and materials deposited thereon to fully expose the balance of the substrate surface.

BRIEF DESCRIPTION OF THE DRAWINGS

The accompanying drawings, which are incorporated in and form a part of the specification, illustrate preferred embodiments of the present invention, and together with the description, serve to explain the principles of the invention.

In the drawings.

DETAILED DESCRIPTION OF THE PREFERRED EMBODIMENTS

Figure 1:
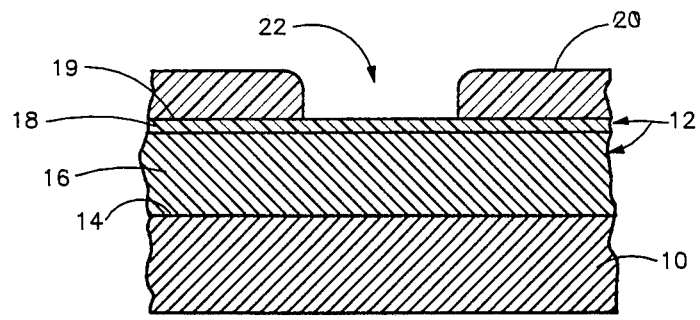
FIGS. 1–5 illustrate cross-sectional schematic views of a semiconductor device at various stages of processing in accordance with one embodiment of the present invention.

It has been previously demonstrated that device quality epitaxial films such as GaAs may be grown on various dissimilar semiconductor substrates. These processes are important, for example, in the formation of field effect transistors (F.E.T.) as well as in the formation of double heterostructure junction lasers. The application of the present invention has particular interest in the formation of Si and GaAs integrated circuits on a single monolithic Si wafer. Such a semiconductor device would permit the utilization of the high-frequency or optoelectronic capabilities of GaAs in conjunction with highly developed Si (very large scale integration) (VLSI) technologies. Moreover, the application of the process of the present invention to monolithic high-efficiency cascade junction solar cells is also of interest.

Some of the specific benefits of the present invention are that it allows for better edge delineation of the deposited epitaxial films as well as for greater ease of lift-off of thick layers deposited on the bilayer mask in addition to the mask itself. Another distinct benefit of the present invention is that it creates a diffusion barrier to impurities from the epitaxial material that might alter the electrical properties of any underlying semiconductor devices already in the substrate.

In general, the process of the present invention involves the selective patterning of epitaxial film growth on the surface of a semiconductor substrate by forming a bilayer masking member on the surface of a substrate. The masking member includes a first layer disposed on the substrate surface and a second layer which covers the first layer. The first layer is selected from a material adapted to preferentially dissolve at a substantially greater rate than the second layer or the substrate when it is exposed to a selected etchant. After formation of the bilayer mask, a window is then opened in a selected portion of the second layer by removing that portion so as to expose the first layer thereunder.

The selected etchant is then introduced through the window so as to preferentially dissolve a portion of the first layer immediately beneath the window. This process exposes the substrate surface directly beneath the window. It also creates an overhanging shelf-like portion with the second layer by undercutting the edges of the second layer adjacent to the window. The epitaxial film is then deposited by any number of known means, preferably MBE, on the exposed substrate surface directly beneath the window while polycrystalline material is simultaneously being deposited on the bilayer mask. Finally, a second etchant is then introduced through the window to dissolve the first layer so as to lift-off the second layer and any material deposited thereon and fully expose the balance of the substrate surface. In this manner, a cleanly defined epitaxial film is deposited on the substrate surface at preselected position as defined by the window created in the top layer of the bilayer mask.

Referring now to FIGS. 1–5, a specific embodiment of the present invention will be described. It is understood, however, that the invention is not to be limited to the specific substances and parameters of the preferred embodiment, but rather is to be defined by the claims as provided later herein.

Referring to FIG. 1, a Si substrate 10 is first selected. Any suitable semiconductor substrate material such as Si, GaAs, or the like may be utilized with the process of the present invention. However, Si is the substrate of choice in this embodiment and is preferably in the form of a monolithic chip. A bilayer masking member 12 is then deposited on the surface 14 of the substrate 10. The masking member 12 includes a first layer 16 disposed on the surface 14 of the substrate 10 and a second layer 18 covering the first layer 16. In this preferred embodiment, the first layer 16 comprises $SiO_2$, and the second layer comprises silicon nitride. The $SiO_2$/silicon nitride bilayer combination was selected because $SiO_2$ is preferentially etched at a much faster rate than silicon nitride when exposed to a dilute hydroflouric acid etchant. This etching rate ratio between the $SiO_2$ and the silicon nitride will be affected to a degree by the stoichiometry of the silicon nitride. Any suitable technique for depositing the bilayer components may be utilized. Moreover, any bilayer masking combination may be used in the present invention so long as the material for the first layer is preferentially etched at a much faster rate than the material for the second layer when a preselected etchant is used, the substrate material being unaffected by the selected etchant. The importance of this will become evident as the invention is further discussed below.

Once the bilayer masking member 12 is deposited on the substrate 10, patterning means are deposited on the upper surface 19 of the second layer 18 so as to cover a preselected portion thereof. In the example illustrated in FIG. 1, the means consists of standard photoresist material 20 patterned so as to form an opening or window 22 therein. Any standard photolithographic or photoresist deposition means and techniques may be utlized with the present invention. The purpose of the photoresist is to define the window 22 through which the epitaxial layer may ultimately be deposited on the surface 14.

Figure 2:
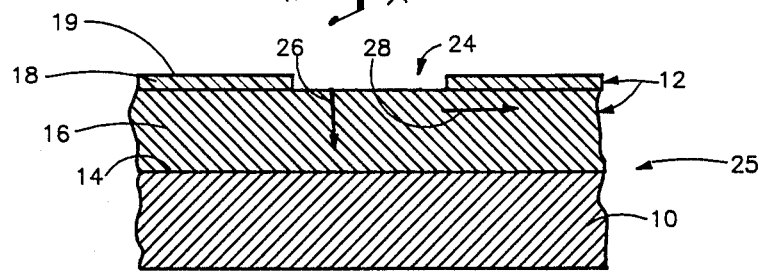

Once the photoresist 20 is positioned on the surface of the bilayer masking member 12, a selected portion of the second layer 18 is dissolved using known techniques such as plasma etching through the window 22 so as to create a second window 24 in the layer 18 as illustrated in FIG. 2. This window 24 is defined by the photoresist 20. In the preferred embodiment, the selected portion of the silicon nitride layer 18 was plasma etched in a barrel-type etcher using a $CF_4$ based gas. In this instance, silicon nitride layer 18 is etched at a substantially faster rate (four times faster) than that of the $SiO_2$ layer 16 so as to create the window 24 without substantially affecting the $SiO_2$ layer 16. In this manner, the $SiO_2$ layer acts as a stop for the plasma etch thereby opening up the silicon nitride window defined by the photoresist 20. Once this window 24 has been formed, the photoresist 20 is removed by standard photoresist stripping techniques well known to the art.

Figure 3:
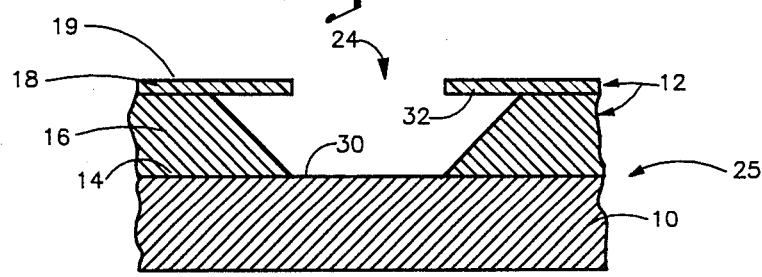

Continuing the process of the present invention and with particular reference to FIGS. 2 and 3, an appropriate etchant is then introduced through the window 24. The simplest way of achieving this is to take the entire wafer or chip 25 and immerse it in an etchant bath. In the preferred embodiment, the selected etchant is a dilute buffered hydrofluoric (HF) acid etch. This is because a buffered HF solution provides a very controllable etch rate in $SiO_2$. Since the HF etches the $SiO_2$ a factor of ten times faster than the silicon nitride, very little of the silicon nitride will be removed while a substantial portion of the $SiO_2$ is removed as illustrated in FIG. 3. Due to the preferential etching rate, the etchant dissolves the $SiO_2$ vertically downwardly as illustrated by arrow 26 in FIG. 2 as well as horizontally under the silicon nitride, as illustrated by arrow 28. As a result of this preferential etching, a portion 30 of the surface of the Si substrate 10 immediately beneath the window 24 is exposed while simultaneously creating an overhanging ledge portion 32 in the silicon nitride layer 18 by undercutting the edges of the silicon nitride immediately adjacent to the window 24. Once sufficient $SiO_2$ is removed so as to expose the surface 30 and create the ledge portion 32, the wafer 25 is removed from the HF bath.

In an alternate embodiment, only the $SiO_2$ directly beneath the window 24 is first dissolved. Once the surface portion 30 is fully exposed the $SiO_2$ is subjected to a second etchant to create the ledge portion 32.

Figure 4:
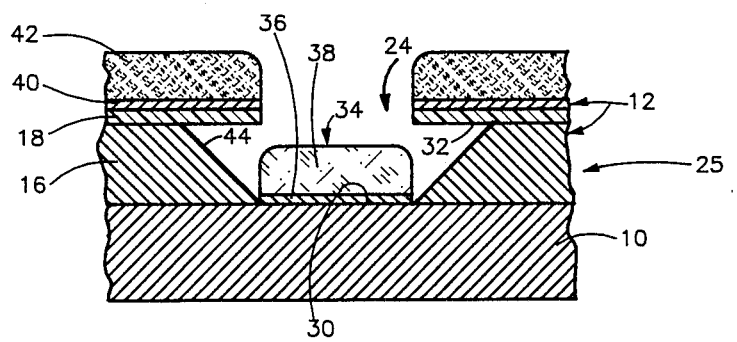
Figure 5:
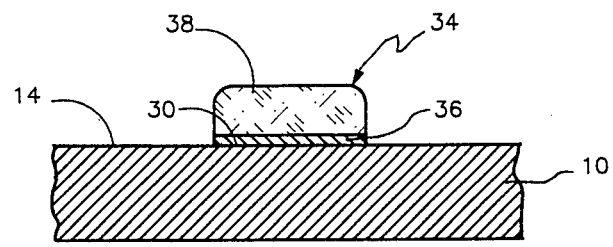

Once the wafer 25 is removed from the HF bath, the epitaxial layer is then immediately deposited. As indicated in FIG. 4, the epitaxial film layer 34 includes a first layer 36 of Ge deposited directly on the Si followed by a much thicker second layer 38 of GaAs. In preferred form, the GaAs/Ge layers are deposited through the window 24 onto the Si surface 30 by standard MBE techniques. However, other deposition techniques such as chemical vapor deposition (CVD), metal organic chemical vapor deposition (MOCVD), and the like may be utilized. Moreover, the epitaxial material may be selected from the Group IV elements from the Periodic Table and combinations of Group III and Group V elements. As alluded to previously, preferred epitaxial materials are Ge and GaAs.

As illustrated in FIG. 4, both the Ge and the GaAs formed on the Si surface 30 are in the form of single crystal or epitaxial growth, while the Ge layer 40 and GaAs layer 42 deposited on the silicon nitride are polycrystalline in form. Since it has been previously demonstrated that dislocation density in GaAs diminishes as thicker epilayers are grown, and since this effective decrease in dislocation density corresponds to enhanced electrical and optical properties, it is highly desirable to grow the GaAs epilayer 38 greater than 2.0 microns in thickness to optimize material quality. It should also be pointed out that due to the ledge portion 32 in the silicon nitride layer 18, neither Ge nor GaAs are deposited on the shadowed surfaces 44 of the $SiO_2$ immediately beneath the ledge portion 32. This is an important factor in the final step of this process.

Once the layers of Ge and GaAs are formed on the Si surface 30, a second etchant is introduced through the window 24. In the preferred form, this etchant comprises a concentrated HF etch solution in which the wafer 25 is submerged. Concentrated HF will not dissolve nor affect the GaAs, Ge or Si surfaces with which it comes in contact. However, it rapidly attacks $SiO_2$. Given the clean $SiO_2$ surfaces 44 shadowed by the ledge portions 32, the HF etch solution rapidly attacks the remaining portion of the $SiO_2$ layer 16 at the surface 44 thereby dissolving it. This causes the silicon nitride layers 18 with their polycrystalline Ge and polycrystalline GaAs layers thereon to lift off completely, leaving the structure depicted in FIG. 5. Again, the choice of etchant solutions may vary depending upon the material selected for the first layer 16 and the substrate 10 as well as the epitaxial film 34. However, none of the etchants used during any step of the subject process should alter or in any way affect the GaAs, Ge and Si.

As previously indicated, the preferred materials for the epitaxial film 34 are GaAs/Ge. This is due to the fact that the intermediate Ge layer aids in the nucleation of GaAs on Si where there is a substantial mismatch in lattice structure between GaAs and Si. However, GaAs may be grown directly on Si if desired. Moreover, other epitaxial film layers may be grown in the manner described above such as ternary III - V compounds (e.g., AlGaAs) and quaternary III - V compounds.

One of the distinct advantages of the present invention is to permit a clean lift-off of the second layer of the bilayer masking member and the material deposited thereon. As previously indicated, it is desirable to grow a thick layer of the epitaxial material, in particular GaAs. One of the distinct problems with prior art epitaxial growth techniques is that when such thick epitaxial materials were grown, single layer masking processes were insufficient to obtain a clean lift-off. As a result, some of the masking material remained attached to the semiconductor substrate thereby interfering with full operation of the semiconductor device. The present invention overcomes this problem.

Another distinct advantage of the present invention is that it permits the initial formation of Si semiconductor devices in the Si substrate followed by deposition of the GaAs or other epitaxial material. The production of Si semiconductor devices in a monolithic Si chip involves techniques well known in the art. Such Si semiconductor device formation generally requires very high temperatures. The temperature at which GaAs and other similar epitaxial materials are deposited and formed is substantially lower than those temperatures which are required for the processing of Si semiconductor devices. Moreover, such epitaxial material is very negatively affected by the high temperatures required for Si semiconductor production. As a result, the Si semiconductor devices must first be formed in the monolithic Si chip before any GaAs or other epitaxial deposition thereon.

Figure 6:
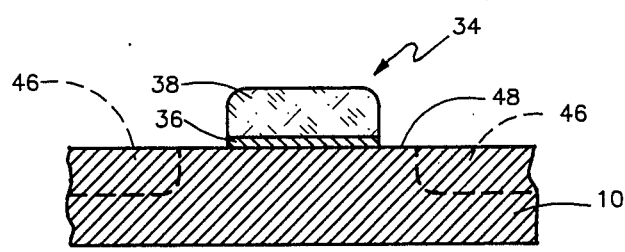
FIG. 6 is a cross-sectional view of a semiconductor substrate formed in accordance with the present invention and illustrating the preformation of semiconductor devices in the substrate prior to implementing the process of the present invention.

FIG. 6 illustrates a cross-sectional view of a Si semiconductor chip having both Si semiconductor devices as well as GaAs/Ge epitaxial semiconductor devices thereon. More specifically, the Si substrate material 10 includes Si semiconductor devices 46 previously formed therein. The area 48 between the devices 46 is the area in which the epitaxial material is formed. In FIG. 6, the epitaxial material 34 illustrated therein includes a Ge layer 36 deposited initially in the space 48 followed by a GaAs layer 38 deposited on the Ge layer 36 as more thoroughly discussed above. Thus, the patterning for the resist illustrated in FIG. 1 is designed so as to cover the areas of the substrate 10 containing the semiconductor devices 46. This would allow for windows 22 between the photoresist 20 to be formed over the areas 48. There are two distinct advantages with the process of the present invention in the formation of a device as illustrated in FIG. 6. First, due to the overhanging ledge portion 32 of the second layer 18 as illustrated in FIG. 4, the epitaxial layer 34 is not deposited directly on the substrate surfaces above the semiconductor devices 46. This prevents poisoning of the semiconductor devices 46 as a result of any diffusion of epitaxial material. For example, both Ga and As are dopants for Si semiconductor devices and as such would change the electrical properties of the semiconductor devices 46. Thus, the bilayer masking member of the present invention acts as a diffusion barrier to Ga and As. Second, the present process also allows one to do all the high temperature Si device processing prior to the epitaxial growth. This permits the formation of both epitaxial semiconductor devices as well as Si semiconductor devices on a single Si monolithic chip as illustrated in FIG. 7.

Figure 7:
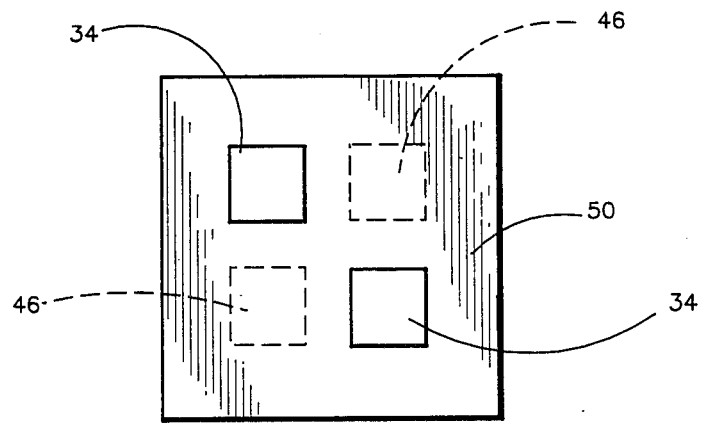
FIG. 7 is a schematic top planar view of a silicon chip having semiconductor devices patterned thereon in accordance with the process of the present invention.

With respect to FIG. 7, a single Si monolithic chip 50 is illustrated as having Si semiconductor devices 46 embedded therein as well as epitaxial semiconductor layers 34 formed thereon. In this manner, the same Si monolithic chip can take advantage of the high-frequency or optoelectronic capabilities of GaAs with highly developed Si VLSI technologies. It should be noted that FIG. 7 is very representative of actual photomicrographs of Si chips having epitaxial layers formed thereon in accordance with the process of the present invention. Very clearly defined edges of the GaAs/Ge layer 34 are formed with no residual masking material or polycrystalline GaAs remaining on the Si chip 50. This permits clean interconnect formation between the devices 34 and 46 on the chip 50.

EXAMPLE I

Epitaxial layers of Ge and GaAs were grown on a Si substrate. The Si substrate used for Example I was a heavily doped p-type, oriented 2° off the <100> towards the <111> direction. Prior to growth of the epitaxial layer, the Si substrate was treated using a standard silicon cleaning procedure. After the Si cleaning procedure, the substrate was etched in dilute hydrofluoric acid to remove the surface oxide. The sample was then quickly mounted on a Mo block with indium and transferred to an MBE system. An updoped Ge layer was first deposited at a rate of approximately 0.4 Å/second from a pyrolytic boron nitride source. The total thickness of the Ge film was on the order of 0.2 microns and was deposited at a substrate temperature of 300° C. Once the Ge layer was completed, the substrate temperature was increased to 610° C., and four microns of GaAs were deposited at a rate of one micron/h. The first 0.5 microns of the GaAs was undoped, and the remaining 3.5 microns were doped with Sn. This GaAs structure was used to evaluate the electric properties for measurement purposes only.

Reflection high energy electron diffraction (RHEED) was used to investigate the surface structure and morphology of the GaAs/Ge layer at various stages of growth. The surface morphologies of grown layers were mirror smooth and very reproducible. On a macroscopic scale, the GaAs film grown on the Si was indistinguishable from high quality MBE GaAs layers. In order to evaluate the quality of the grown layers, van der Pauw-Hall measurements were made. Room temperature mobilities of 2800 $cm^2$/V-sec have been measured on n-type GaAs grown on Ge/Si doped at a level of $4 \times 10^{17}$ carriers/$cm^3$. MBE grown GaAs/GaAs structures doped at the same level exhibit a mobility of 3200 $cm^2$/Vsec. This represented only a 12.5% difference in mobility for GaAs/Ge grown on Si substrates. Capacitance-voltage measurements verified the Hall effect data and indicated that the GaAs layers were uniformly doped within the depleted region.

This particular Example I clearly indicated that the possiblity of growing device-quality GaAs on Si provides the opportunity to produce new device structures, including monolithic GaAs/Si integrated circuits. The process of the present invention provides the clear and clean lift-off technique necessary to form such structures while preventing destruction or alteration of the underlying Si devices.

EXAMPLE II

A specific test of the present invention included the preparation of the Si substrate nominally oriented in the <100> direction. After cleaning of the Si substrate, a 7,000 Å thermal oxide was grown on the Si substrate. This $SiO_2$ layer was then followed by 2,000 Å silicon nitride that RF sputter deposited from a silicon nitride target. The silicon nitride was deposited at a rate of 500 Å/minute with the substrate held at 200° C. This structure was then patterned using conventional photolithographic techniques as depicted in FIG. 1. The silicon nitride layer was then plasma-etched in a barrel type etcher using a $CF_4$ based gas (LSE DE100). For the silicon nitride composition obtained in the sputter deposited films, the effective etch rate of the silicon nitride was about four times faster than the $SiO_2$. Therefore, the $SiO_2$ layer acted as a stop for the plasma etch and opened up a window defined by the photoresist. The resist was then stripped off and the wafter thoroughly degreased.

The wafer was then immersed in a dilute buffered HF etch. Since the HF etched the $SiO_2$ a factor of ten times faster than the silicon nitride, the overhanging ledge portions indicated in FIG. 3 were formed. The wafer was then quickly mounted on a Mo block with indium and transferred to an MBE system. The unintentionally doped Ge layer was deposited at a rate of approximately 0.4 Å/sec from a pyrolytic boron nitride source. The total thickness of the layer was 500 Å, and it was deposited at a substrate temperature of 300° C. Once the Ge layer was completed, 5,000 Å of GaAs were deposited at a substrate temperature of 610° C. When the growth was completed, the sample was removed from the Mo block and immersed in a concentrated HF etch solution. This etchant rapidly attacked the remaining $SiO_2$ layer and caused the GaAs/Ge/silicon nitride layers to lift-off, leaving a structure similar to that depicted in FIG. 5.

EXAMPLE III

To further test the process of the present invnetion, a single-layer $SiO_2$ mask without any silicon nitride layer was used, and the patterning technique similar to that given in Example II was followed. In this instance, the processing sequence and growth conditions were identical to those described in Example II except for the elimination of the silicon nitride layer. In this instance, lift-off was incomplete, and GaAs/Ge/$SiO_2$ residual material remained on the Si substrate. Ultrasonic agitation in the HF etch at elevated temperatures failed to complete the lift-off. In this instance, edge acuity of the GaAs epitaxial layers was extremely poor. Consequently, the bilayer process of the present invention is clearly an advantage in providing complete lift-off.

In studying the resultant structure of Example II made in accordance with the process of the present invention and prior to mask lift-off, RHEED patterns clearly showed that single crystal GaAs and Ge were formed on the Si substrate, where polycrystalline growth dominated in areas where the bilayer mask was present. In addition, a scanning electron micrograph of the completed structure demonstrated completed lift-off with very good edge acuity. As a result of this, it is now believed that the capability of lifting off thicker GaAs/Ge layers can be realized by the replacement of a thermally grown $SiO_2$ layer with a much thicker CVD $SiO_2$ film.

Equally important to lift-off yield is the necessity for the bilayer mask to act as a diffusion barrier for the Ga, As and Ge present during MBE growth. These impurities, if allowed to diffuse in the active region of a Si device, could alter its desired characteristics as previously indicated. An ion microprobe depth profile of the Si of the device formed in accordance with Example II was obtained from an area where this bilayer mask had been removed using a Cameca ims-3f secondary ion mass spectrometer with a rastered Cs+ ion beam. This profile was identical to the profile obtained from a pure Si substrate that had not been subjected to the GaAs/Ge growth environment. This clearly demonstrated that the bilayer mask did act as a diffusion barrier to GaAs and Ge in that these impurities were not present in any measurably significant amount.

From the above descriptions and examples, it is clear that the present invention demonstrates an important process for producing very powerful semiconductor devices. The present invention permits preprocessing of high temperature substrate devices prior to growth of the GaAs epilayer at lower temperatures so that diffusion of Ga or As impurities into the Si or other semiconductor substrate does not occur to impede the performance of any preprocessed devices therein. In addition, where preprocessed Si devices are so present, they may be readily masked from epitaxial growth in the substrate areas containing them so that unwanted polycrystalline growth can be readily and completely lifted off, thereby exposing the underlying preprocessed devices. This is necessary so that during the final processing steps of such a device having preprocessed Si semiconductor devices as well as epitaxial III - V semiconductor devices, appropriate interconnects can be made between the semiconductor devices on the same chip. It is critical that the lift-off yield be 100% so that the final processing steps can proceed unimpeded by polycrystalline fragments remaining behind. The present invention permits such 100% lift-off. Finally, the present invention also allows the bilayer mask to act as a diffusion barrier to the epitaxial layer materials which are present during epitaxial growth. Thus, the present invention overcomes prior lift-off problems so as to form smooth, distinct epitaxial layer junctions and permits the formation of powerful semiconductor devices.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalence may be resorted to within the scope of the invention as defined by the claims which follow.

The embodiments of the invention in which an exclusive property or privilege is claimed are defined as follows:

1. A process for selectively patterning epitaxial film growth on a semiconductor substrate comprising:
   forming a masking member on the surface of said substrate, said masking member having at least two layers including a first layer disposed on said substrate and a second layer covering said first layer;
   opening a window in a selected portion of said second layer by removing said portion to expose the first layer thereunder;
   subjecting said first layer to an etchant introduced through said window to dissolve said first layer a sufficient amount to expose the substrate surface directly beneath said window, said first layer adapted to preferentially dissolve at a substantially greater rate than said second layer so as to create an overhanging ledge portion in said second layer by undercutting the edges thereof adjacent to said window;
   depositing said epitaxial film on said exposed substrate surface directly beneath said window; and
   introducing an etchant through said window to dissolve the remainder of said first layer so as to lift off the second layer and materials deposited thereon to fully expose the balance of said substrate surface.

2. The process as described in claim 1, wherein said window is opened by selectively patterning the surface of said second layer with photoresist means and etching the remaining exposed second layer to form said window therein, said first layer being substantially resistant to said etching.

3. The process as described in claim 1, wherein said second layer is adapted for preferential dissolution at a rate substantially faster than said first layer when exposed to a preselected etchant used to create said window.

4. The process as described in claim 1, wherein said first layer is silicon dioxide and said second layer is silicon nitride.

5. The process as described in claim 4, wherein said etchant preferentially dissolving said first layer comprises hydrofluoric acid.

6. The process as described in claim 1, wherein said epitaxial film is selected from the group consisting of GaAs, Ge and combinations thereof.

7. The process as described in claim 1, wherein said epitaxial film is deposited on said substrate by molecular beam epitaxy.

8. The process as described in claim 1, wherein said substrate comprises silicon.

9. The process as described in claim 1, wherein said overhanging ledge portion is adapted to protect at least a portion of said first layer from deposition of said epitaxial film so as to provide a site for attack by the final etchant to permit dissolution of the balance of said first layer and complete lift-off of said second layer.

10. The process as described in claim 1, wherein said first layer is dissolved by the first etchant introduced through said window at substantially the same rate vertically toward said substrate as well as horizontally along the bottom surface of said second layer, thereby creating said overhanging ledge portion.

11. In a process for depositing epitaxial films on a semiconductor substrate surface in a selected pattern wherein said substrate is masked, a window is formed in the mask, the epitaxial film is deposited on said substrate through said window, and the mask is then lifted off to expose the balance of said substrate, the improvement comprising the steps of:
   forming a bilayer mask on said substrate, said mask having a first layer adjacent said substrate and a second layer covering said first layer with said first layer being preferentially etched at a faster rate than said second layer when exposed to a selected etchant;
   forming said window in the second layer and introducing said selected etchant through said window so as to create an overhanging ledge portion with said second layer by undercutting the edges thereof adjacent said window; and dissolving the balance of said first layer after epitaxial film deposition by introducing an etchant through said window thereby providing complete lift-off of said second layer and any material deposited thereon.

12. The improvement as described in claim 11, wherein said second layer overhanging ledge portion is sufficient to protect at least a portion of said first layer from deposition of said epitaxial film so as to provide a site for attack by the final etchant to permit dissolution of the balance of said first layer and complete lift-off of said second layer and materials deposited thereon, and wherein said film selected from said Group IV elements comprises Ge, and said film selected from said combinations of Groups III and V elements comprises GaAs.

13. The improvement process as described in claim 12, wherein said window is opened by selectively patterning the surface of said second layer with photoresist means and etching the exposed second layer to form said window therein, said first layer being substantially resistant to said etching, said photoresist means being removed after opening of said window.

14. The improvement as described in claim 11, wherein said first layer is silicon dioxide and said second layer is silicon nitride, wherein said epitaxial film is selected from the group consisting of Group IV elements, and combinations of Group III and Group V elements, and wherein said substrate is silicon.

15. A process for fabricating silicon and GaAs semiconductor devices on a single silicon substrate comprising:
    forming spaced silicon semiconductor devices on said substrate;
    covering said substrate with a bilayer masking member having a first layer disposed on said substrate surface and a second layer covering said first layer, said first layer being adapted to preferentially dissolve at a faster rate than said second layer when exposed to a preselected etchant;
    opening a plurality of windows in said second layer in a preselected pattern above the spaces between said silicon semiconductor devices to expose portions of said first layer thereunder;
    subjecting said first layer to said preselected etchant introduced through said windows to expose the substrate surface beneath each said window and create overhanging ledge portions in said second layer by undercutting the edges thereof adjacent to each said window;
    depositing said GaAs on said exposed substrate surfaces beneath each said window and on said second layer surface, said GaAs growing epitaxially on said silicon substrate in the spaces between said silicon semiconductor devices; and
    introducing a second etchant through said windows to dissolve the balance of said first layer so as to lift-off said second layer and polycrystalline GaAs thereon and fully expose the balance of said substrate surface and said silicon semiconductor devices.

16. The process as described in claim 15, wherein each said second layer overhanging ledge portion is sufficient to protect at least a portion of said first layer from deposition of said GaAs so as to provide a site for attack by said preselected etchant to permit dissolution of the balance of said first layer and complete lift-off of said second layer, said first layer being dissolved by said preselected etchant at substantially the same rate vertically downwardly toward said silicon substrate as well as horizontally along the bottom surface of said second layer.

17. The process as described in claim 15, wherein an intermediate layer is first deposited on said exposed substrate surface and said GaAs is then deposited on said intermediate layer, said intermediate layer being selected from the group consisting of Group IV elements and combinations of Groups III and V elements.

18. The process as described in claim 17, wherein said Ge and GaAs are deposited by molecular beam epitaxy.

19. The process as described in claim 15, wherein said windows are opened by selectively patterning the surface of said second layer with photoresist means and etching the remaining exposed second layer to form said windows therein, said first layer being substantially resistant to said etching and said photoresist means being removed after opening of said windows.

* * * * *